United States Patent
Zhou et al.

(10) Patent No.: US 11,282,977 B2
(45) Date of Patent: Mar. 22, 2022

(54) SILICON CARBIDE DETECTOR AND PREPARATION METHOD THEREFOR

(71) Applicant: THE 13TH RESEARCH INSTITUTE OF CHINA ELECTRONICS TECHNOLOGY GROUP CORPORATION, Shijiazhuang (CN)

(72) Inventors: Xingye Zhou, Shijiazhuang (CN); Zhihong Feng, Shijiazhuang (CN); Yuanjie Lv, Shijiazhuang (CN); Xin Tan, Shijiazhuang (CN); Yuangang Wang, Shijiazhuang (CN); Xubo Song, Shijiazhuang (CN); Jia Li, Shijiazhuang (CN); Yulong Fang, Shijiazhuang (CN)

(73) Assignee: The 13th Research institute of China Electronics Technolegy Group Corporation, Shijiazhuang (CN)

( * ) Notice: Subject to any disclaimer, the term of this patent is extended or adjusted under 35 U.S.C. 154(b) by 67 days.

(21) Appl. No.: 17/031,989

(22) Filed: Sep. 25, 2020

(65) Prior Publication Data
US 2021/0020802 A1 Jan. 21, 2021

Related U.S. Application Data

(63) Continuation of application No. PCT/CN2017/112427, filed on Oct. 29, 2018.

(30) Foreign Application Priority Data

May 4, 2018 (CN) .......................... 201810421559.X

(51) Int. Cl.
*H01L 21/00* (2006.01)
*H01L 31/18* (2006.01)
(Continued)

(52) U.S. Cl.
CPC .... *H01L 31/1812* (2013.01); *H01L 21/02378* (2013.01); *H01L 31/03529* (2013.01);
(Continued)

(58) Field of Classification Search
CPC ......... H01L 31/1812; H01L 31/035281; H01L 31/03529; H01L 31/06; H01L 31/1037;
(Continued)

(56) References Cited

U.S. PATENT DOCUMENTS

| 4,922,218 A | 5/1990 | Watanabe et al. |
| 2010/0140730 A1* | 6/2010 | Soloviev ............... H01L 29/861 |
| | | 257/433 |

(Continued)

FOREIGN PATENT DOCUMENTS

| CN | 10507078 A | 6/2004 |
| CN | 101752367 A | 6/2010 |

(Continued)

*Primary Examiner* — Calvin Y Choi
(74) *Attorney, Agent, or Firm* — Slater Matsil, LLP

(57) ABSTRACT

The disclosure provides a silicon carbide detector and a preparation method therefor. The silicon carbide detector comprises: a wafer, the wafer sequentially comprises, from bottom to top, a substrate, a silicon carbide P+ layer, an N-type silicon carbide insertion layer, an N+ type silicon carbide multiplication layer, an N-type silicon carbide absorption layer and a silicon carbide N+ layer; the doping concentration of the N-type silicon carbide insertion layer gradually increases from bottom to top, and the doping concentration of the N-type silicon carbide absorption layer gradually decreases from bottom to top; a mesa is etched on the wafer, and the mesa is etched to an upper surface of the silicon carbide P+ layer; an N-type electrode is arranged on an upper surface of the mesa, and a P-type electrode is arranged on an upper surface of a non-mesa region.

17 Claims, 2 Drawing Sheets

(51) Int. Cl.
*H01L 31/06* (2012.01)
*H01L 31/103* (2006.01)
*H01L 31/0352* (2006.01)
*H01L 21/02* (2006.01)
*C01B 32/956* (2017.01)

(52) U.S. Cl.
CPC ...... *H01L 31/035281* (2013.01); *H01L 31/06* (2013.01); *H01L 31/1037* (2013.01); *C01B 32/956* (2017.08)

(58) Field of Classification Search
CPC ........... H01L 21/02378; H01L 31/0236; H01L 31/18; H01L 31/101; H01L 31/02161; H01L 31/107; H01L 31/022408; H01L 31/028–0288; H01L 31/0312–03125; H01L 31/1804–1824; H01L 29/6606; H01L 31/1075; C01B 32/956
USPC .......................................................... 438/87
See application file for complete search history.

(56) References Cited

U.S. PATENT DOCUMENTS

| | | | |
|---|---|---|---|
| 2010/0216274 A1* | 8/2010 | Yang | ................... H01L 31/1824 438/58 |
| 2011/0308583 A1 | 12/2011 | Joshi et al. | |
| 2018/0102442 A1* | 4/2018 | Wang | ....................... H01L 31/02 |

FOREIGN PATENT DOCUMENTS

| | | | |
|---|---|---|---|
| CN | 105720130 A | | 6/2016 |
| CN | 106653932 A | * | 5/2017 |
| CN | 106653932 A | | 5/2017 |

\* cited by examiner

SILICON CARBIDE DETECTOR AND PREPARATION METHOD THEREFOR

CROSS-REFERENCE TO RELATED APPLICATIONS

This application is a continuation application of International Application No. PCT/CN2018/112427, filed on Oct. 29, 2018, which claims priority to Chinese Patent Application No. CN201810421559.X, filed on May 4, 2018. The disclosures of the aforementioned applications are hereby incorporated herein by reference in their entireties.

TECHNICAL FIELD

The disclosure relates to the technical field of semiconductors, and in particular to a silicon carbide detector and a preparation method therefor.

BACKGROUND

Since the ultraviolet radiation with a wavelength in the range from 100 nm to 280 nm is absorbed and blocked by the ozone layer to a very low level near the earth, solar-blind ultraviolet detectors have advantages such as low background noise from visible to infrared radiation, low false warning rate, etc., which are very important and promising in the applications of ultraviolet warning, ultraviolet communication, ultraviolet astronomy, and so on.

A Wide Band Gap Semiconductor (WBGS) ultraviolet detector represented by gallium nitride (GaN) and silicon carbide (SiC) does not respond to visible light, which is inherently visible-blind. Compared with GaN material, silicon carbide is more mature in material growth with a lower defect density, which is a preferred material for preparing ultraviolet photodetectors.

A silicon carbide ultraviolet photodetector may have a structure, such as a metal-semiconductor-metal (MSM) structure, a Schottky barrier structure, a PN structure, a PIN structure, and a Separated Absorption and Multiplication (SAM) structure. Compared with other structures, the silicon carbide ultraviolet photodetector with the SAM structure has advantages such as high gain, high responsivity, low operating voltage and low excess noise, etc. which can be attributed to the separation of an absorption layer and a multiplication layer. However, due to a tunneling effect of a PN junction with high doping concentration in the SAM structure, a dark current of a device increases sharply when a reverse bias voltage is close to a breakdown voltage, thereby reducing a Signal to Noise Ratio (SNR) of the silicon carbide ultraviolet photodetectors.

SUMMARY

These and other problems are generally solved or circumvented, and technical advantages are generally achieved, by embodiments of the present disclosure which provide a silicon carbide detector and a preparation method therefor.

Embodiments of the disclosure provide a silicon carbide detector and a preparation method therefor, for solving the problem in the conventional art that the dark current of the silicon carbide ultraviolet photodetector with the SAM structure increases sharply when the reverse bias voltage is close to the breakdown voltage and thus the signal-to-noise ratio of the photodetector reduces.

A first aspect of the embodiments of the disclosure provides a silicon carbide detector. The silicon carbide detector comprises a wafer. The wafer sequentially comprises, from bottom to top, a substrate, a silicon carbide $P^+$ layer, an N-type silicon carbide insertion layer, an $N^+$ type silicon carbide multiplication layer, an N-type silicon carbide absorption layer, and a silicon carbide $N^+$ layer. A doping concentration of the N-type silicon carbide insertion layer gradually increases from bottom to top. A doping concentration of the N-type silicon carbide absorption layer gradually decreases from bottom to top. A mesa is etched on the wafer. The mesa is etched to an upper surface of the silicon carbide $P^+$ layer. An N-type electrode is arranged on an upper surface of the mesa. A P-type electrode is arranged on an upper surface of a non-mesa region. The non-mesa region is an area excluding a mesa region of the wafer.

In one embodiment, the doping concentration of the N-type silicon carbide insertion layer linearly increases from bottom to top; or the doping concentration of the N-type silicon carbide insertion layer parabolically increases from bottom to top; or the doping concentration of the N-type silicon carbide insertion layer stepwise increases from bottom to top.

In one embodiment, the doping concentration of the N-type silicon carbide absorption layer linearly decreases from bottom to top; or the doping concentration of the N-type silicon carbide absorption layer parabolically decreases from bottom to top; or the doping concentration of the N-type silicon carbide absorption layer stepwise decreases from bottom to top.

In one embodiment, an anti-reflection coating is arranged on an upper surface of an area of the mesa excluding an N-type electrode area of the mesa.

In one embodiment, a passivation layer is arranged on a side surface of the mesa, and on an upper surface of an area of the non-mesa region excluding a P-type electrode area of the non-mesa region.

In one embodiment, the mesa is tilted with a preset angle.

In one embodiment, the doping concentration of the N-type silicon carbide insertion layer is $10^{15}$ cm$^{-3}$ to $10^{19}$ cm$^{-3}$, and a thickness of the N-type silicon carbide insertion layer is 0.1 μm to 1 μm.

In one embodiment, the doping concentration of the N-type silicon carbide absorption layer is $10^{18}$ cm$^{-3}$ to $5 \times 10^{19}$ cm$^{-3}$, and a thickness of the N-type silicon carbide absorption layer is 0.5 μm to 2 μm.

In one embodiment, a doping concentration of the silicon carbide $P^+$ layer is $10^{18}$ cm$^{-3}$ to $10^{20}$ cm$^{-3}$, and a thickness of the silicon carbide $P^+$ layer is 1 μm to 3 μm.

A doping concentration of the $N^+$ type silicon carbide multiplication layer is $10^{18}$ cm$^{-3}$ to $5 \times 10^{19}$ cm$^{-3}$, and a thickness of the $N^+$ type silicon carbide multiplication layer is 0.1 μm to 0.3 μm.

A doping concentration of the silicon carbide $N^+$ layer is $10^{18}$ cm$^{-3}$ to $10^{20}$ cm$^{-3}$, and a thickness of the silicon carbide $N^+$ layer is 0.03 μm to 0.3 μm.

A second aspect of the embodiments of the disclosure provides a preparation method of a silicon carbide detector. The method includes the following operations: forming a mesa on a wafer of a silicon carbide detector by etching. The wafer sequentially comprises, from bottom to top, a substrate, a silicon carbide $P^+$ layer, an N-type silicon carbide insertion layer, an $N^+$ type silicon carbide multiplication layer, an N-type silicon carbide absorption layer, and a silicon carbide $N^+$ layer. A doping concentration of the N-type silicon carbide insertion layer gradually increases from bottom to top. A doping concentration of the N-type silicon carbide absorption layer gradually decreases from bottom to top. The mesa is etched to an upper surface of the silicon carbide P+ layer; forming an N-type electrode on an upper surface of the mesa; and forming a P-type electrode on an upper surface of the non-mesa region of the wafer. The non-mesa region is an area excluding a mesa region of the wafer.

Compared with the conventional art, the embodiments of the disclosure have the following beneficial effects: by inserting the N-type silicon carbide insertion layer with a doping concentration changing gradually between the silicon carbide P+ layer and the N+ type silicon carbide multiplication layer, a tunneling distance of carriers between the silicon carbide P+ layer and the N+ type silicon carbide multiplication layer increases, thereby reducing the dark current caused by the tunneling effect. Moreover, the N-type silicon carbide absorption layer with a doping concentration changing gradually may reduce the tunneling effect between the N+ type silicon carbide multiplication layer and the N-type silicon carbide absorption layer, and further reduce the dark current of the device, thereby improving the signal-to-noise ratio and ensuring a higher quantum efficiency of the device.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposed of the present disclosure. It should also be realized by those skilled in the art that such equivalent constructions do not depart from the spirit and scope of the disclosure as set forth in the appended claims.

BRIEF DESCRIPTION OF THE DRAWINGS

In order to more clearly illustrate technical solutions in embodiments of the disclosure, the accompanying drawings for description of the embodiments or the conventional art are introduced below. It is apparent that the accompanying drawings in the following description are only some illustrative embodiments of the disclosure. For those skilled in the art, other drawings can also be obtained according to these accompanying drawings without paying creative effort.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of this disclosure are discussed in detail below. It should be appreciated, however, that the concepts disclosed herein can be embodied in a wide variety of specific contexts. The specific embodiments discussed are merely illustrative, and do not limit the scope of the claims.

For illustration not for limiting, the following description presents specific details like specific system structures and technologies, so as to fully understand the embodiments of the disclosure. However, those skilled in the art should know that the disclosure may also be implemented in other embodiments without these specific details. In other cases, the detailed descriptions of the well-known systems, devices, circuits and methods are omitted for the sake of brevity.

For illustrative purpose, the technical solutions of the disclosure are illustrated below through specific Examples.

Example 1

Figure 1:
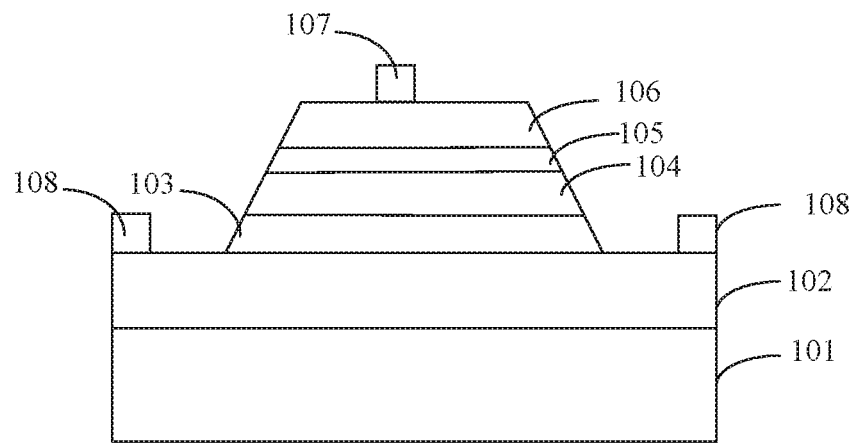
FIG. 1 is a section view of a structure of a silicon carbide detector according to an embodiment of the disclosure.

Referring to FIG. 1, a silicon carbide detector comprises a wafer. The wafer sequentially comprises, from bottom to top, a substrate 101, a silicon carbide P+ layer 102, an N-type silicon carbide insertion layer 103, an N+ type silicon carbide multiplication layer 104, an N-type silicon carbide absorption layer 105, and a silicon carbide N+ layer 106. A doping concentration of the N-type silicon carbide insertion layer 103 gradually increases from bottom to top. A doping concentration of the N-type silicon carbide absorption layer 105 gradually decreases from bottom to top. A mesa is etched on the wafer. The mesa is etched to an upper surface of the silicon carbide P+ layer 102. An N-type electrode 107 is arranged on an upper surface of the mesa. A P-type electrode 108 is arranged on an upper surface of a non-mesa region. The non-mesa region is the area excluding a mesa region of the wafer.

In the embodiments of the disclosure, the silicon carbide detector is used for detecting the ultraviolet light. The material of the silicon carbide detector is 4H-SiC. The mesa is formed on the wafer by etching the silicon carbide N+ layer 106, the N-type silicon carbide absorption layer 105, the N+ type silicon carbide multiplication layer 104 and the N-type silicon carbide insertion layer 103 of the non-mesa region of the wafer in sequence through photolithography and etching process. The mesa region is the area where the mesa locates, and the non-mesa region is the area, excluding the mesa region, of the wafer. A metal is deposited on the upper surfaces of an N-type electrode area in the mesa region and of a P-type electrode area in the non-mesa region through an evaporation process, and then the N-type electrode 107 and the P-type electrode 108 are formed after annealing treatment. The P-type electrode 108 is a ring electrode surrounding the mesa. The materials of the N-type electrode 107 and the P-type electrode 108 may be one or more selected from nickel, titanium, aluminum and gold.

In one embodiment, the substrate 101 is a silicon carbide substrate. The wafer is formed by growing the silicon carbide P+ layer 102, the N-type silicon carbide insertion layer 103, the N+ type silicon carbide multiplication layer 104, the N-type silicon carbide absorption layer 105, and the silicon carbide N+ layer 106 in sequence on the silicon carbide substrate through a homoepitaxy process. In such a manner, a lattice mismatch between the substrate 101 and the silicon carbide P+ layer 102 may be reduced, thereby obtaining the wafer with high quality.

In the embodiments of the disclosure, by inserting the N-type silicon carbide insertion layer 103 with a doping concentration changing gradually between the silicon carbide P+ layer 102 and the N+ type silicon carbide multiplication layer 104, a tunneling distance of carriers between the silicon carbide P+ layer 102 and the N+ type silicon carbide multiplication layer 104 increases, thereby reducing the dark current caused by the tunneling effect. Moreover, the N-type silicon carbide absorption layer 105 with a doping concentration changing gradually may reduce the tunneling effect between the N+ type silicon carbide multiplication layer 104 and the N-type silicon carbide absorption layer 105, thereby further reducing the dark current of the device.

In one embodiment, the doping concentration of the N-type silicon carbide insertion layer 103 linearly increases from bottom to top. Alternatively, the doping concentration of the N-type silicon carbide insertion layer 103 parabolically increases from bottom to top. Alternatively, the doping concentration of the N-type silicon carbide insertion layer 103 stepwise increases from bottom to top.

In one embodiment, the doping concentration of the N-type silicon carbide absorption layer 105 linearly decreases from bottom to top. Alternatively, the doping concentration of the N-type silicon carbide absorption layer 105 parabolically decreases from bottom to top. Alternatively, the doping concentration of the N-type silicon carbide absorption layer 105 stepwise decreases from bottom to top.

Figure 2:
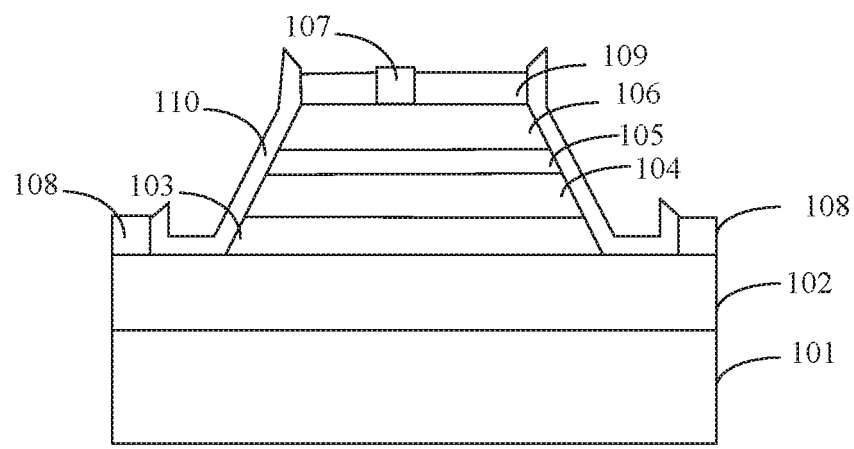
FIG. 2 is a section view of a structure of a silicon carbide detector according to another embodiment of the disclosure.

In one embodiment, referring to FIG. 2, an anti-reflection coating 109 is arranged on an upper surface of the area, excluding the N-type electrode area, of the mesa.

In the embodiments of the disclosure, the anti-reflection coating 109 may be one or more selected from a silicon oxide layer, an aluminum oxide layer, a chromium oxide layer, a yttrium oxide layer and a silicon nitride layer. A thickness of the anti-reflection coating 109 may be 20 nm to 2 μm. An anti-reflection coating is formed on the upper surface of the wafer. The anti-reflection coating on the non-mesa region and the upper surface of the N-type electrode is removed through photolithography and etching process. Therefore, the anti-reflection coating 109 is formed on the upper surface of the area of the mesa excluding the N-type electrode area of the mesa. The anti-reflection coating 109 may effectively reduce reflection of incident light on the surface of the device, thereby improving the responsivity of the detector.

In one embodiment, referring to FIG. 2, a passivation layer 110 may be arranged on a side surface of the mesa, and on the upper surface of the area of the non-mesa region excluding the P-type electrode area of the non-mesa region.

In the embodiments of the disclosure, the passivation layer no may be one or more selected from a silicon oxide layer, an aluminum oxide layer, a chromium oxide layer, a yttrium oxide layer and a silicon nitride layer. A thickness of the passivation layer no may be 50 nm to 10 μm. The passivation layer no may effectively suppress a leakage current of the detector, thereby improving the signal-to-noise ratio of the detector.

In one embodiment, the mesa is tilted with a preset angle.

In the embodiments of the disclosure, the mesa has a positively tilted preset angle. The tilted mesa with a preset angle may effectively inhibit pre-breakdown of the device. The tilted mesa with a preset angle is formed by a photoresist reflow process: a photoresist layer with a tilted preset angle is coated on the mesa region, and then the wafer is etched through the etching process.

In one embodiment, the doping concentration of the N-type silicon carbide insertion layer 103 is $10^{15}$ cm$^{-3}$ to $10^{19}$ cm$^{-3}$, and the thickness of the N-type silicon carbide insertion layer 103 is 0.1 μm to 1 μm.

In one embodiment, the doping concentration of the N-type silicon carbide absorption layer 105 is $10^{18}$ cm$^{-3}$ to $5 \times 10^{19}$ cm$^{-3}$, and the thickness of the N-type silicon carbide absorption layer 105 is 0.5 μm to 2 μm.

In one embodiment, the doping concentration of the silicon carbide P+ layer 102 is $10^{18}$ cm$^{-3}$ to $10^{20}$ cm$^{-3}$, and the thickness of the silicon carbide P+ layer 102 is 1 μm to 3 μm.

In one embodiment, the doping concentration of the N+ type silicon carbide multiplication layer 104 is $10^{18}$ cm$^{-3}$ to $5 \times 10^{19}$ cm$^{-3}$, and the thickness of the N+ type silicon carbide multiplication layer 104 is 0.1 μm to 0.3 μm.

The doping concentration of the silicon carbide N+ layer 106 is $10^{18}$ cm$^{-3}$ to $10^{20}$ cm$^{-3}$, and the thickness of the silicon carbide N+ layer 106 is 0.03 μm to 0.3 μm.

Example 2

Figure 3:
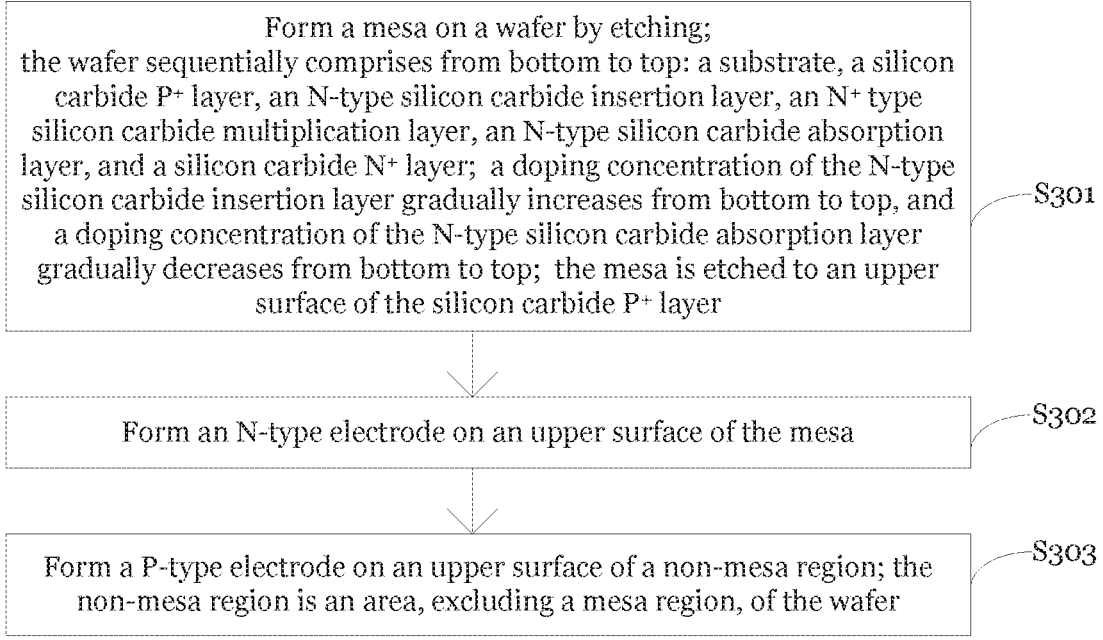
FIG. 3 is a flow diagram of a preparation method of a silicon carbide detector according to an embodiment of the disclosure.

Referring to FIG. 3, a preparation method of a silicon carbide detector includes the following steps.

At S301, a mesa is formed on a wafer of the silicon carbide detector by etching. The wafer sequentially comprises, from bottom to top: a substrate, a silicon carbide P+ layer, an N-type silicon carbide insertion layer, an N+ type silicon carbide multiplication layer, an N-type silicon carbide absorption layer, and a silicon carbide N+ layer. A doping concentration of the N-type silicon carbide insertion layer gradually increases from bottom to top, and the doping concentration of the N-type silicon carbide absorption layer gradually decreases from bottom to top. The mesa is etched to an upper surface of the silicon carbide P+ layer.

At S302, an N-type electrode is formed on an upper surface of the mesa.

At S303, a P-type electrode is formed on an upper surface of a non-mesa region of the wafer. The non-mesa region is an area, excluding the mesa region, of the wafer.

In one embodiment, the preparation method further includes that a passivation layer is formed on a side surface of the mesa and an upper surface of the area, excluding the P-type electrode area, of the non-mesa region.

In one embodiment, the preparation method further includes that an anti-reflection coating is formed on an upper surface of the area, excluding the N-type electrode area, of the mesa.

In one embodiment, the doping concentration of the N-type silicon carbide insertion layer linearly increases from bottom to top.

In one embodiment, the doping concentration of the N-type silicon carbide insertion layer parabolically increases from bottom to top.

In one embodiment, the doping concentration of the N-type silicon carbide insertion layer stepwise increases from bottom to top.

In one embodiment, the doping concentration of the N-type silicon carbide absorption layer linearly decreases from bottom to top.

Alternatively, the doping concentration of the N-type silicon carbide absorption layer parabolically decreases from bottom to top.

Alternatively, the doping concentration of the N-type silicon carbide absorption layer stepwise decreases from bottom to top.

In one embodiment, the mesa is a tilted mesa with a preset angle.

In one embodiment, a doping concentration of the N-type silicon carbide insertion layer is $10^{15}$ cm$^{-3}$ to $10^{19}$ cm$^{-3}$. A thickness of the N-type silicon carbide insertion layer is 0.1 μm to 1 μm.

In one embodiment, a doping concentration of the N-type silicon carbide absorption layer is $10^{18}$ cm$^{-3}$ to $5\times10^{19}$ cm$^{-3}$. A thickness of the N-type silicon carbide absorption layer is 0.5 μm to 2 μm.

In one embodiment, a doping concentration of the silicon carbide P$^+$ layer is $10^{18}$ cm$^{-3}$ to $10^{20}$ cm$^{-3}$. A thickness of the silicon carbide P$^+$ layer is 1 μm to 3 μm.

In one embodiment, a doping concentration of the N$^+$ type silicon carbide multiplication layer is $10^{18}$ cm$^{-3}$ to $5\times10^{19}$ cm$^{-3}$. A thickness of the N$^+$ type silicon carbide multiplication layer is 0.1 μm to 0.3 μm.

A doping concentration of the silicon carbide N$^+$ layer is $10^{18}$ cm$^{-3}$ to $10^{20}$ cm$^{-3}$. A thickness of the silicon carbide N$^+$ layer is 0.03 μm to 0.3 μm.

The above preparation method of the silicon carbide detector may be used to prepare the silicon carbide detector described in the Example 1 of the disclosure, and the above preparation method has the beneficial effects of the Example 1.

It should be understood that the step numbers in the above Examples do not mean a sequence of performing steps, and the sequence of performing steps should be determined by their functions and an internal logic. The step numbers should not limit the preparation method of the embodiments of the disclosure.

Although embodiments of the present disclosure have been described in detail, it should be understood that various changes, substitutions and alterations can be made herein without departing from the spirit and scope of the disclosure as defined by the appended claims.

Moreover, the scope of the present disclosure is not intended to be limited to the particular embodiments described here. As one of ordinary skill in the art will readily appreciate from the disclosure of the present disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A silicon carbide detector, comprising:
a wafer, the wafer sequentially comprising: from bottom to top, a substrate, a silicon carbide P$^+$ layer, an N-type silicon carbide insertion layer, an N$^+$ type silicon carbide multiplication layer, an N-type silicon carbide absorption layer, and a silicon carbide N$^+$ layer;
wherein a doping concentration of the N-type silicon carbide insertion layer gradually increases from bottom to top, and the doping concentration of the N-type silicon carbide absorption layer gradually decreases from bottom to top;
wherein a mesa is etched on the wafer, and the mesa is etched to an upper surface of the silicon carbide P$^+$ layer; and
wherein an N-type electrode is arranged on an upper surface of the mesa, and a P-type electrode is arranged on an upper surface of a non-mesa region, and the non-mesa region is an area excluding a mesa region of the wafer.

2. The silicon carbide detector of claim 1, wherein:
the doping concentration of the N-type silicon carbide insertion layer linearly increases from bottom to top; or
the doping concentration of the N-type silicon carbide insertion layer parabolically increases from bottom to top; or
the doping concentration of the N-type silicon carbide insertion layer stepwise increases from bottom to top.

3. The silicon carbide detector of claim 2, wherein:
a doping concentration of the silicon carbide P$^+$ layer is $10^{18}$ cm$^{-3}$ to $10^{20}$ cm$^{-3}$, and a thickness of the silicon carbide P$^+$ layer is 1 μm to 3 μm;
a doping concentration of the N$^+$ type silicon carbide multiplication layer is $10^{18}$ cm$^{-3}$ to $5\times10^{19}$ cm$^{-3}$, and a thickness of the N$^+$ type silicon carbide multiplication layer is 0.1 μm to 0.3 μm; and
a doping concentration of the silicon carbide N$^+$ layer is $10^{18}$ cm$^{-3}$ to $10^{20}$ cm$^{-3}$, and a thickness of the silicon carbide N$^+$ layer is 0.3 μm to 0.3 μm.

4. The silicon carbide detector of claim 1, wherein:
the doping concentration of the N-type silicon carbide absorption layer linearly decreases from bottom to top; or
the doping concentration of the N-type silicon carbide absorption layer parabolically decreases from bottom to top; or
the doping concentration of the N-type silicon carbide absorption layer stepwise decreases from bottom to top.

5. The silicon carbide detector of claim 4, wherein:
a doping concentration of the silicon carbide P$^+$ layer is $10^{18}$ cm$^{-3}$ to $10^{20}$ cm$^{-3}$, and a thickness of the silicon carbide P$^+$ layer is 1 μm to 3 μm;
a doping concentration of the N$^+$ type silicon carbide multiplication layer is $10^{18}$ cm$^{-3}$ to $5\times10^{19}$ cm$^{-3}$, and a thickness of the N$^+$ type silicon carbide multiplication layer is 0.1 μm to 0.3 μm; and
a doping concentration of the silicon carbide N$^+$ layer is $10^{18}$ cm$^{-3}$ to $10^{20}$ cm$^{-3}$, and a thickness of the silicon carbide N$^+$ layer is 0.3 μm to 0.3 μm.

6. The silicon carbide detector of claim 1, wherein an anti-reflection coating is arranged on an upper surface of an area of the mesa excluding an N-type electrode area of the mesa.

7. The silicon carbide detector of claim 6, wherein:
a doping concentration of the silicon carbide P$^+$ layer is $10^{18}$ cm$^{-3}$ to $10^{20}$ cm$^{-3}$, and a thickness of the silicon carbide P$^+$ layer is 1 μm to 3 μm;
a doping concentration of the N$^+$ type silicon carbide multiplication layer is $10^{18}$ cm$^{-3}$ to $5\times10^{19}$ cm$^{-3}$, and a thickness of the N$^+$ type silicon carbide multiplication layer is 0.1 μm to 0.3 μm; and
a doping concentration of the silicon carbide N$^+$ layer is $10^{18}$ cm$^{-3}$ to $10^{20}$ cm$^{-3}$, and a thickness of the silicon carbide N$^+$ layer is 0.3 μm to 0.3 μm.

8. The silicon carbide detector of claim 1, wherein a passivation layer is arranged on a side surface of the mesa, and on an upper surface of an area of the non-mesa region excluding a P-type electrode area of the non-mesa region.

9. The silicon carbide detector of claim 8, wherein:
a doping concentration of the silicon carbide P$^+$ layer is $10^{18}$ cm$^{-3}$ to $10^{20}$ cm$^{-3}$, and a thickness of the silicon carbide P$^+$ layer is 1 μm to 3 μm;
a doping concentration of the N$^+$ type silicon carbide multiplication layer is $10^{18}$ cm$^{-3}$ to $5\times10^{19}$ cm$^{-3}$, and a thickness of the N$^+$ type silicon carbide multiplication layer is 0.1 μm to 0.3 μm; and
a doping concentration of the silicon carbide N$^+$ layer is $10^{18}$ cm$^{-3}$ to $10^{20}$ cm$^{-3}$, and a thickness of the silicon carbide N$^+$ layer is 0.3 μm to 0.3 μm.

10. The silicon carbide detector of claim 1, wherein the mesa is tilted with a preset angle.

11. The silicon carbide detector of claim 10, wherein:
a doping concentration of the silicon carbide P$^+$ layer is $10^{18}$ cm$^{-3}$ to $10^{20}$ cm$^{-3}$, and a thickness of the silicon carbide P$^+$ layer is 1 μm to 3 μm;
a doping concentration of the N$^+$ type silicon carbide multiplication layer is $10^{18}$ cm$^{-3}$ to $5\times10^{19}$ cm$^{-3}$, and a thickness of the N$^+$ type silicon carbide multiplication layer is 0.1 μm to 0.3 μm; and
a doping concentration of the silicon carbide N$^+$ layer is $10^{18}$ cm$^{-3}$ to $10^{20}$ cm$^{-3}$, and a thickness of the silicon carbide N$^+$ layer is 0.3 μm to 0.3 μm.

12. The silicon carbide detector of claim 1, wherein the doping concentration of the N-type silicon carbide insertion layer is $10^{15}$ cm$^{-3}$ to $10^{19}$ cm$^{-3}$, and a thickness of the N-type silicon carbide insertion layer is 0.1 μm to 1 μm.

13. The silicon carbide detector of claim 12, wherein:
a doping concentration of the silicon carbide P$^+$ layer is $10^{18}$ cm$^{-3}$ to $10^{20}$ cm$^{-3}$, and a thickness of the silicon carbide P$^+$ layer is 1 μm to 3 μm;
a doping concentration of the N$^+$ type silicon carbide multiplication layer is $10^{18}$ cm$^{-3}$ to $5\times10^{19}$ cm$^{-3}$, and a thickness of the N$^+$ type silicon carbide multiplication layer is 0.1 μm to 0.3 μm; and
a doping concentration of the silicon carbide N$^+$ layer is $10^{18}$ cm$^{-3}$ to $10^{20}$ cm$^{-3}$, and a thickness of the silicon carbide N$^+$ layer is 0.3 μm to 0.3 μm.

14. The silicon carbide detector of claim 1, wherein the doping concentration of the N-type silicon carbide absorption layer is $10^{18}$ cm$^{-3}$ to $5\times10^{19}$ cm$^{-3}$, and a thickness of the N-type silicon carbide absorption layer is 0.5 μm to 2 μm.

15. The silicon carbide detector of claim 14, wherein:
a doping concentration of the silicon carbide P$^+$ layer is $10^{18}$ cm$^{-3}$ to $10^{20}$ cm$^{-3}$, and a thickness of the silicon carbide P$^+$ layer is 1 μm to 3 μm;
a doping concentration of the N$^+$ type silicon carbide multiplication layer is $10^{18}$ cm$^{-3}$ to $5\times10^{19}$ cm$^{-3}$, and a thickness of the N$^+$ type silicon carbide multiplication layer is 0.1 μm to 0.3 μm; and
a doping concentration of the silicon carbide N$^+$ layer is $10^{18}$ cm$^{-3}$ to $10^{20}$ cm$^{-3}$, and a thickness of the silicon carbide N$^+$ layer is 0.3 μm to 0.3 μm.

16. The silicon carbide detector of claim 1, wherein:
a doping concentration of the silicon carbide P$^+$ layer is $10^{18}$ cm$^{-3}$ to $10^{20}$ cm$^{-3}$, and a thickness of the silicon carbide P$^+$ layer is 1 μm to 3 μm;
a doping concentration of the N$^+$ type silicon carbide multiplication layer is $10^{18}$ cm$^{-3}$ to $5\times10^{19}$ cm$^{-3}$, and a thickness of the N$^+$ type silicon carbide multiplication layer is 0.1 μm to 0.3 μm; and
a doping concentration of the silicon carbide N$^+$ layer is $10^{18}$ cm$^{-3}$ to $10^{20}$ cm$^{-3}$, and a thickness of the silicon carbide N$^+$ layer is 0.3 μm to 0.3 μm.

17. A method comprising:
forming a mesa on a wafer of a silicon carbide detector by etching, wherein the wafer sequentially comprises, from bottom to top, a substrate, a silicon carbide P$^+$ layer, an N-type silicon carbide insertion layer, an N$^+$ type silicon carbide multiplication layer, an N-type silicon carbide absorption layer, and a silicon carbide N$^+$ layer, wherein a doping concentration of the N-type silicon carbide insertion layer gradually increases from bottom to top, and a doping concentration of the N-type silicon carbide absorption layer gradually decreases from bottom to top, and wherein the mesa is etched to an upper surface of the silicon carbide P$^+$ layer;
forming an N-type electrode on an upper surface of the mesa; and
forming a P-type electrode on an upper surface of a non-mesa region of the wafer, wherein the non-mesa region is an area of the wafer excluding a mesa region of the wafer.

* * * * *

UNITED STATES PATENT AND TRADEMARK OFFICE
CERTIFICATE OF CORRECTION

PATENT NO. : 11,282,977 B2
APPLICATION NO. : 17/031989
DATED : March 22, 2022
INVENTOR(S) : Xingye Zhou It is certified that error appears in the above-identified patent and that said Letters Patent is hereby corrected as shown below:

On the Title Page

Item (73), Assignee; delete "institute" and insert --Institute--.

Item (73), Assignee; delete "Technolegy" and insert --Technology--.

Signed and Sealed this
Twenty-sixth Day of April, 2022

Katherine Kelly Vidal
*Director of the United States Patent and Trademark Office*